(12) United States Patent
Arai

(10) Patent No.: US 6,369,507 B1
(45) Date of Patent: *Apr. 9, 2002

(54) ORGANIC EL DISPLAY APPARATUS WITH A SWITCHING DEVICE

(75) Inventor: Michio Arai, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/339,806

(22) Filed: Jun. 25, 1999

(30) Foreign Application Priority Data

Jun. 7, 1999  (JP) .......................................... 11-159425

(51) Int. Cl.⁷ .............................. H01J 1/62; H01J 63/04
(52) U.S. Cl. ...................... 313/506; 313/504; 313/509; 428/690
(58) Field of Search .............................. 313/506, 503, 313/504, 509, 498; 428/690

(56) References Cited

U.S. PATENT DOCUMENTS

| 5,457,565 A | 10/1995 | Namiki et al. ............... 359/273 |
| 5,684,365 A | * 11/1997 | Tang et al. ............... 315/169.3 |
| 5,739,635 A | 4/1998 | Wakimoto .................... 313/504 |
| 5,952,779 A | 9/1999 | Arai et al. .................... 313/504 |
| 5,969,474 A | 10/1999 | Arai ............................. 313/504 |
| 6,180,963 B1 | * 1/2001 | Arai ............................. 257/103 |

FOREIGN PATENT DOCUMENTS

| EP | 0 423 283 | 4/1991 |
| JP | 58-73994 | 5/1983 |
| JP | 4-276668 | 10/1992 |
| JP | 5-3080 | 1/1993 |
| JP | 5-343183 | 12/1993 |
| JP | 6-163158 | 6/1994 |
| JP | 08-241047 | 9/1996 |
| JP | 8-241048 | 9/1996 |
| JP | 8-288069 | 11/1996 |
| JP | 9-17574 | 1/1997 |
| JP | 10-92577 | 4/1998 |
| JP | 10-125474 | 5/1998 |
| JP | 10-270172 | 10/1998 |
| JP | 10-319907 | 12/1998 |
| JP | 10-340787 | 12/1998 |
| JP | 11-500574 | 1/1999 |
| WO | WO 96/29747 | 9/1996 |

OTHER PUBLICATIONS

S. Tokito, et al., J. Phys. D: Appl. Phys., vol. 29, pp. 2750–2753, "Metal Oxides as a Hole–Injecting Layer for an Organic Electroluminescent Device," 1996.

* cited by examiner

Primary Examiner—Nimeshkumar D. Patel
Assistant Examiner—Kevin Quarterman
(74) Attorney, Agent, or Firm—Oblon, Spivak, McClelland, Maier & Neustadt, P.C.

(57) ABSTRACT

An object of the invention is to provide an organic EL display apparatus using an organic EL device capable of light emission to a high luminance at a relatively low voltage so that the apparatus is prevented from erroneous light emission and a drop of contrast and features a high operating speed. The object is achieved by an organic EL display apparatus comprising a switching device comprising a controlling electrode and a set of controlled electrodes formed on a non-single-crystal silicon substrate, and an organic EL device adapted to be driven by the switching device and comprising a positive electrode, a negative electrode, and an organic layer between the electrodes participating in at least a light emitting function, the organic EL device further comprising a high resistance inorganic electron injecting and transporting layer between the organic layer and the negative electrode capable of blocking holes and having conduction paths for carrying electrons, or a high resistance inorganic hole injecting and transporting layer between the organic layer and the positive electrode capable of blocking electrons and having conduction paths for carrying holes, or both.

16 Claims, 7 Drawing Sheets

ORGANIC EL DISPLAY APPARATUS WITH A SWITCHING DEVICE

BACKGROUND OF THE INVENTION

1. Technical Field

This invention relates to an organic EL display apparatus comprising an organic EL device and a driving device and more particularly, to an organic EL display apparatus adapted to drive an organic EL device having an organic-inorganic junction structure using a thin film transistor having a non-single-crystal semiconductor thin film as a substrate.

2. Background Art

In the prior art, a technique of simple driving an organic EL display by a X-Y matrix circuit to perform image display is known (JP-A 2-37385 and 3-233891). However, such simple driving carries out line sequential driving. In the event that the scanning number is as many as several hundreds of lines, the required instantaneous luminance becomes several hundred times the observed luminance, and the following problems arise.

(1) The drive voltage becomes high. Since the voltage usually becomes at least 2 or 3 times the DC constant voltage, the efficiency drops. So the power consumption increases.

(2) Since the quantity of instantaneously conducted current becomes several hundred times, the organic light emitting layer is liable to deteriorate.

(3) Since a very large quantity of current conducts as in (2), the voltage drop across electrode wiring becomes significant.

As a measure for solving the above problems (1) to (3), the following active matrix driving was proposed. U.S. Pat. No. 4,143,297 discloses a display using an inorganic substance ZnS as a fluorescent substance and carrying out active matrix driving. This technique, however, suffers from the problem that the drive voltage is as high as 100 volts or above on account of the use of an inorganic fluorescent substance. A similar technique is described in IEEE Trans Electron Devices, 802 (1971). By contrast, there were recently developed many displays using organic fluorescent substances and carrying out active matrix driving (see JP-A 7-122360, 7-122361, 7-153576, 8-54836, 7-111341, 7-312290, 8-109370, 8-129359, 8-241047 and 8-227276). The above technique has many advantages. Using organic fluorescent substances, the drive voltage is drastically reduced to a low level of 10 volts or below. When high efficiency organic fluorescent substances are used, the efficiency is very high in the range of 3 to 15 lm/W. Also, the drive voltage of a high definition display becomes ½ to ⅓ as compared with the simple driving, achieving a reduction of power consumption. Despite these advantages, the following becomes a problem.

FIGS. 11 and 12 illustrate a prior art exemplary TFT drive circuit. Referring to these figures, one prior art exemplary active matrix is now described.

FIG. 11 is a panel block diagram in which a display panel 310 has a display screen 311, an X axis shift register 312, and a Y axis shift register 313.

The display screen 311 is powered by an EL power supply. The X axis shift register 312 is powered by a shift resister power supply and receives X axis synchronizing signals as the input. The Y axis shift register 313 is powered by a shift resister power supply and receives Y axis synchronizing signals as the input. The output section of the X axis shift register 312 has an output of image data signals.

FIG. 12 is an enlarged view of a portion delimited by circle A in FIG. 11. The display screen 311 has pixels, with one pixel (depicted by a broken line rectangular block) consisting of two transistors, one capacitor, and one EL device.

The radiative operation of one pixel is performed as follow. For example, when the Y axis shift register 313 delivers an address signal y1, the X axis shift register 312 delivers an address signal x1, transistors Ty11 and Tx1 are turned on.

As a result, an image data signal −VL is supplied to the gate of a drive transistor M11. This allows a current corresponding to the gate voltage to flow between the drain and the source of the drive transistor M11 from the EL power supply whereby an EL device EL110 emits light.

At the next timing, the X axis shift register 12 interrupts the supply of address signal x1 and instead, delivers an address signal x2, but the gate voltage of the drive transistor M11 is held by a capacitor c11. The light emission of the EL element EL110 is sustained until the same pixel is subsequently selected.

Consequently, even if the time allotted to one pixel is reduced by the increasing number of scanning lines, the driving of the organic EL device is not affected and the contrast of the image appearing on the display panel is not reduced. Therefore, the active matrix system enables to display images of significantly high quality as compared with the simple matrix system.

In the case of organic EL devices, the luminance of light emission depends on the current density applied because they are current-driven devices. When one intends to improve the luminance of light emission within the same pixel area, or when one intends, in the situation where the number of pixels is increased in order to improve the fineness of the overall screen so that the drive time (or time division interval) per pixel is reduced, to further increase the luminance of light emission to compensate for the reduced drive time, it is necessary to increase the drive current. In this regard, if one intends to increase the drive current, then the drive voltage is naturally increased although the relation varies depending on a particular circuit arrangement.

However, if one intends to construct a switching device adapted to accommodate high currents and high voltages, the off-state leakage current Ioff becomes increased, which causes erroneous light emission and a drop of contrast.

SUMMARY OF THE INVENTION

An object of the invention is to provide an organic EL display apparatus using an organic EL device capable of light emission to a high luminance at a relatively low voltage so that the apparatus is prevented from erroneous light emission and a drop of contrast and features a high operating speed.

This and other objects are accomplished by the following constructions.

(1) An organic EL display apparatus comprising a switching device comprising a controlling electrode and a set of controlled electrodes formed on a non-single-crystal silicon substrate, and an organic EL device adapted to be driven by the switching device and comprising a positive electrode, a negative electrode, and an organic layer between the electrodes participating in at least a light emitting function, the organic EL device further comprising a high resistance inorganic electron injecting and transporting layer between the organic layer and the negative electrode capable of blocking holes and having conduction paths for carrying electrons, or a high resistance inorganic hole injecting and transporting layer between the organic layer and the positive electrode capable of blocking electrons and having conduction paths for carrying holes, or both.

(2) The organic EL display apparatus of (1) wherein the high resistance inorganic electron injecting and transporting layer contains at least one oxide of an element selected from the group consisting of alkali metal elements, alkaline earth metal elements, and lanthanide elements, the oxide having a work function of up to 4 eV, as a first component and at least one metal having a work function of 3 to 5 eV as a second component.

(3) The organic EL display apparatus of (1) or (2) wherein the second component is at least one element selected from the group consisting of Zn, Sn, V, Ru, Sm, and In.

(4) The organic EL display apparatus of (1) wherein the alkali metal element is at least one element selected from the group consisting of Li, Na, K, Rb, Cs, and Fr, the alkaline earth metal element is at least one element selected from the group consisting of Mg, Ca, and Sr, and the lanthanide element is selected from La and Ce.

(5) The organic EL display apparatus of (1) wherein the high resistance inorganic electron injecting and transporting layer has a resistivity of 1 to $1 \times 10^{11}$ Ω-cm.

(6) The organic EL display apparatus of (1) wherein the high resistance inorganic electron injecting and transporting layer contains 0.2 to 40 mol % based on the entire components of the second component.

(7) The organic EL display apparatus of (1) wherein the high resistance inorganic electron injecting and transporting layer has a thickness of 0.2 to 30 nm.

(8) The organic EL display apparatus of (1) wherein the high resistance inorganic hole injecting and transporting layer has a resistivity of 1 to $1 \times 10^{11}$ Ω-cm.

(9) The organic EL display apparatus of (1) wherein the high resistance inorganic hole injecting and transporting layer contains a metal and/or at least one member selected from the group consisting of an oxide, carbide, nitride, silicide and boride of the metal.

(10) The organic EL display apparatus of (1) wherein the high resistance inorganic hole injecting and transporting layer contains an oxide of silicon and/or germanium as a main component, the main component being represented by $(Si_{1-x}Ge_x)O_y$ wherein $0 \leq x \leq 1$ and $1.7 \leq y \leq 2.2$, and a metal having a work function of at least 4.5 eV and/or at least one member selected from the group consisting of an oxide, carbide, nitride, silicide and boride of the metal.

(11) The organic EL display apparatus of (10) wherein the metal is at least one member selected from the group consisting of Au, Cu, Fe, Ni, Ru, Sn, Cr, Ir, Nb, Pt, W, Mo, Ta, Pd, and Co.

(12) The organic EL display apparatus of (10) wherein the content of the metal and/or the oxide, carbide, nitride, silicide and boride of the metal is 0.2 to 40 mol %.

(13) The organic EL display apparatus of (1) wherein the high resistance inorganic hole injecting and transporting layer has a thickness of 0.2 to 100 nm.

(14) The organic EL display apparatus of (1) wherein the switching device is a thin film transistor.

(15) The organic EL display apparatus of (1) wherein in the switching device, the non-single-crystal silicon substrate has an active layer with a thickness of 100 to 800 Å.

(16) The organic EL display apparatus of (1) wherein the switching device has a S value of at least 0.8 V/decade.

(17) The organic EL display apparatus of (1) wherein the switching device has an off-current of up to $1 \times 10^{-8}$ A.

DESCRIPTION OF THE PREFERRED EMBODIMENTS

Figure 1:
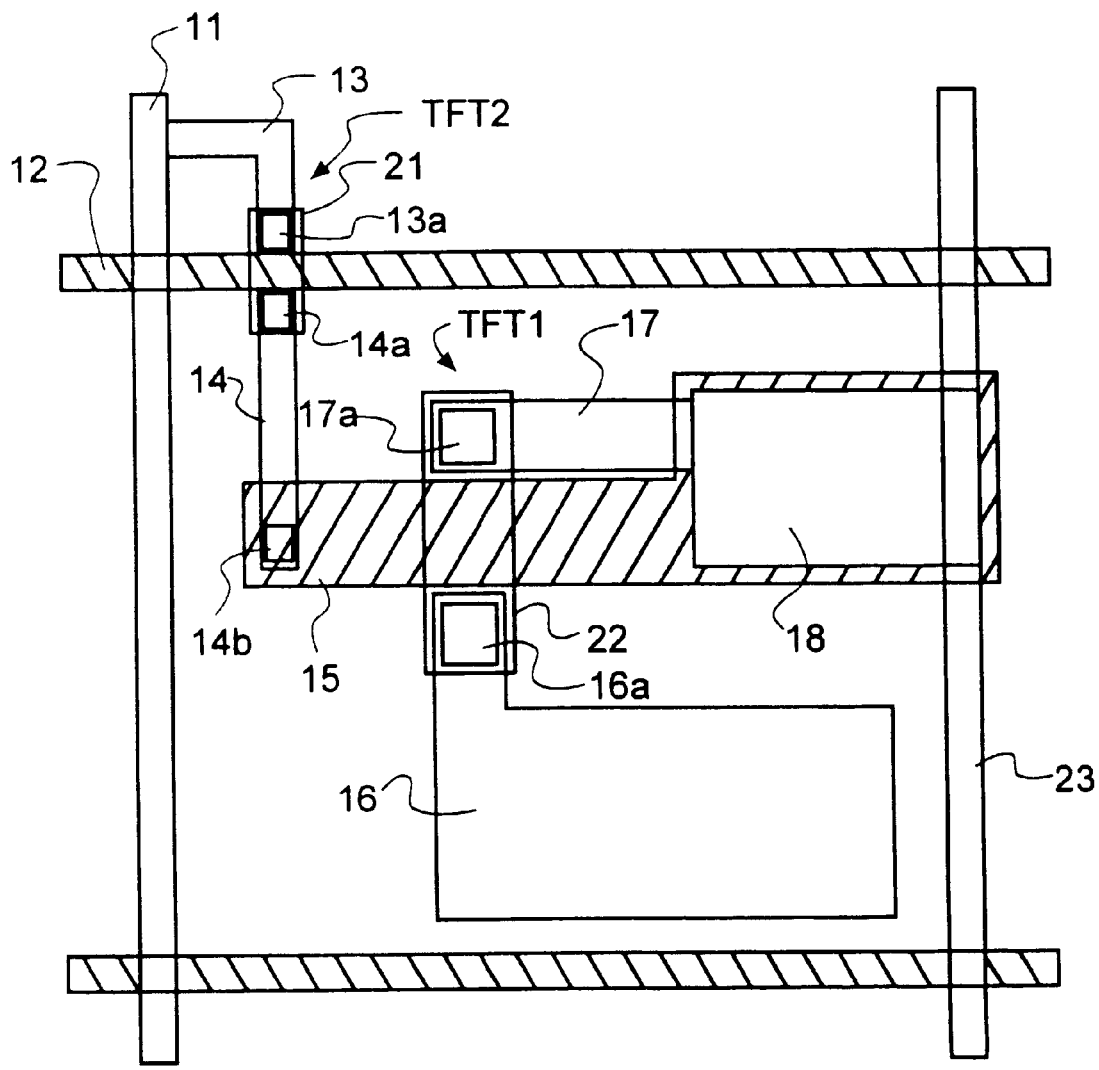
FIG. 1 is a plan view of one exemplary organic EL display apparatus according to the invention.

The organic EL display apparatus of the invention includes a switching device comprising a controlling electrode and a set of controlled electrodes formed on a non-single-crystal silicon substrate, and an organic EL device adapted to be driven by the switching device and comprising a positive electrode, a negative electrode, and an organic layer between the electrodes participating in at least a light emitting function. The organic EL device further has a high resistance inorganic electron injecting and transporting layer between the organic layer and the negative electrode capable of blocking holes and having conduction paths for carrying electrons, or a high resistance inorganic hole injecting and transporting layer between the organic layer and the positive electrode capable of blocking electrons and having conduction paths for carrying holes, or both.

By constructing at least the electron injecting and transporting layer from a high resistance inorganic electron injecting and transporting layer or the hole injecting and transporting layer from a high resistance inorganic hole injecting and transporting layer in the organic EL device adapted to be driven by the switching device formed on a non-single-crystal silicon substrate, the drive voltage is reduced and the luminous efficiency is improved, so that a luminous screen which is bright at a relatively low drive voltage is obtainable.

The organic EL device of the invention has a high resistance inorganic electron injecting and transporting layer between the organic layer participating in a light emitting function and the negative electrode.

By disposing a high resistance inorganic electron injecting and transporting layer having electron conduction paths and capable of blocking holes between the light emitting layer and the negative electrode in this way, there are obtained advantages including efficient injection of electrons into the organic layer, improved luminous efficiency, and a low drive voltage.

Preferably the second component is contained in the high resistance inorganic electron injecting and transporting layer in an amount of 0.2 to 40 mol % based on the entire components to form conduction paths, permitting electrons to be efficiently injected from the negative electrode (or electron injecting electrode) into the organic layer on the light emitting layer side. At the same time, the motion of holes from the organic layer to the electron injecting electrode side can be restrained, achieving efficient recombination of holes and electrons in the organic layer, especially the light emitting layer.

The organic EL device of the invention provides a luminance equal to or greater than prior art organic EL devices and LEDs and have higher heat resistance and weather resistance so that it has a longer lifetime than the prior art devices and is devoid of current leakage or dark spots. Since an inorganic material which is inexpensive, readily available and easy to fabricate is used rather than a relatively expensive organic material, the manufacturing cost can be reduced.

The high resistance inorganic electron injecting and transporting layer preferably has a resistivity of 1 to $1 \times 10^{11}$ $\Omega$–cm and especially $1 \times 10^3$ to $1 \times 10^8$ $\Omega$–cm. The resistivity of the high resistance inorganic electron injecting and transporting layer selected within the range permits the electron injection efficiency to be drastically improved while maintaining high electron blockage. The resistivity of the high resistance inorganic electron injecting and transporting layer may also be determined from a sheet resistance and a film thickness.

Preferably the high resistance inorganic electron injecting and transporting layer contains as a first component, an oxide of at least one alkali metal element selected from among Li, Na, K, Rb, Cs and Fr, at least one alkaline earth metal element selected from among Mg, Ca and Sr, or at least one lanthanide element selected from among La and Ce, the oxide having a work function of up to 4 eV and more preferably 1 to 4 eV. Of these, lithium oxide, magnesium oxide, calcium oxide, and cerium oxide are preferable. When these oxides are used in admixture, the mixing ratio is arbitrary. Preferably the mixture contains at least 50 mol % of lithium oxide calculated as $Li_2O$.

The high resistance inorganic electron injecting and transporting layer further contains at least one element selected from among Zn, Sn, V, Ru, Sm, and In as a second component. The content of the second component is preferably 0.2 to 40 mol %, more preferably 1 to 20 mol %. Outside the range, less contents would lead to a poor electron injecting function and larger contents lead to a poor hole blocking function. When two or more elements are used in combination, the total content should preferably fall in the above range. The second component may be in the form of either a metal element or an oxide.

Incorporating the conductive (low resistance) second component in the high resistance first component means that a conductive material is distributed in an insulating material in the form of islands, creating hopping paths for electron injection.

The oxide as the first component generally has a stoichiometric composition, but may deviate more or less therefrom and take a non-stoichiometric composition. The second component is generally present as an oxide, to which the same applies.

In addition, the high resistance inorganic electron injecting and transporting layer may contain as impurities H and Ne, Ar, Kr or Xe used as the sputtering gas, preferably in a total content of up to 5 at %.

As long as the overall high resistance inorganic electron injecting and transporting layer has the above-described composition on the average, the composition of the layer need not be uniform. A layer structure having a graded concentration in a thickness direction is acceptable.

The high resistance inorganic electron injecting and transporting layer is normally amorphous.

The thickness of the high resistance inorganic electron injecting and transporting layer is preferably about 0.2 to 30 nm, more preferably about 0.2 to 20 nm, most preferably about 0.2 to 10 nm. Outside the range, the electron injecting layer would fail to fully exert its own function.

Methods for preparing the high resistance inorganic electron injecting and transporting layer include various physical and chemical thin film formation methods such as sputtering and evaporation, with the sputtering being preferred. In particular, a multi-source sputtering process of sputtering distinct targets of the first and second components is preferred. The multi-source sputtering process allows the respective targets to be sputtered by appropriate techniques. In the case of single-source sputtering, a target of a mixture of the first and second components may be used.

When the high resistance inorganic electron injecting and transporting layer is formed by sputtering, the sputtering gas is preferably under a pressure of 0.1 to 1 Pa during sputtering. The sputtering gas may be an inert gas such as Ar, Ne, Xe or Kr as used in conventional sputtering apparatus. Nitrogen ($N_2$) may be used if desired. As to the sputtering atmosphere, about 1 to 99% of oxygen ($O_2$) may be added to or mixed with the sputtering gas to carry out reactive sputtering.

The sputtering process may be a high-frequency sputtering process using an RF power supply or a dc sputtering process. The power to the sputtering apparatus is preferably in the range of about 0.1 to 10 W/cm$^2$ for RF sputtering. The rate of film deposition is preferably in the range of 0.5 to 10 nm/min, especially 1 to 5 nm/min.

During deposition, the temperature of the substrate is room temperature (25° C.) to about 150° C.

The organic EL device of the invention has a high resistance inorganic hole injecting and transporting layer between the organic layer and the hole injecting electrode.

By disposing a high resistance inorganic hole injecting and transporting layer having hole conduction paths and capable of blocking electrons between the organic layer and the positive electrode (or hole injecting electrode) in this way, there are obtained advantages including efficient injection of holes into the organic layer, improved luminous efficiency, and a low drive voltage.

Preferably in the high resistance inorganic hole injecting and transporting layer, an oxide of a metal or metalloid such as silicon or germanium is used as the main component, and at least one of metals, metalloids, and/or oxides, carbides, nitrides, silicides and borides thereof, having a work function of at least 4.5 eV, preferably 4.5 to 6 eV, is contained therein to create conduction paths, thereby enabling efficient injection of holes from the hole injecting electrode to the light emitting layer side. Additionally, this restrains the motion of electrons from the organic layer to the hole injecting electrode side, enabling efficient recombination of holes and electrons in the organic layer, especially the light emitting layer.

The high resistance inorganic hole injecting and transporting layer preferably has a resistivity of 1 to $1\times10^{11}$ $\Omega$-cm, and especially $1\times10^3$ to $1\times10^8$ $\Omega$-cm. The resistivity of the high resistance inorganic hole injecting and transporting layer selected within the range permits the hole injection efficiency to be drastically improved while maintaining high electron blockage. The resistivity of the high resistance inorganic hole injecting and transporting layer may also be determined from a sheet resistance and a film thickness. The sheet resistance may be measured by a four-terminal method or the like.

The materials used as the main component are oxides of silicon and germanium. Preferably the main component is represented by

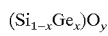

$(Si_{1-x}Ge_x)O_y$ wherein $0 \leq x \leq 1$ and $1.7 \leq y \leq 2.2$, preferably $1.7 \leq y \leq 1.99$. The main component of the high resistance inorganic hole injecting and transporting layer may be silicon oxide, germanium oxide or a mixture of silicon oxide and germanium oxide. If y is outside this range, the layer tends to reduce its hole injecting function. The composition may be determined by Rutherford back-scattering or chemical analysis, for example.

In addition to the main component, the high resistance inorganic hole injecting and transporting layer preferably contains one or more of oxides, carbides, nitrides, silicides and borides of metals (inclusive of metalloids) having a work function of at least 4.5 eV. The metal having a work function of at least 4.5 eV, preferably 4.5 to 6 eV is at least one element selected from among Au, Cu, Fe, Ni, Ru, Sn, Cr, Ir, Nb, Pt, W, Mo, Ta, Pd, and Co. These elements are generally present in the form of metals or oxides. Carbides, nitrides, silicides or borides of these metals are also acceptable. When they are used in admixture, the mixing ratio is arbitrary. The content of these elements is preferably 0.2 to 40 mol %, more preferably 1 to 20 mol %. Outside the range, less contents lead to a poor hole injecting function and larger contents lead to a poor electron blocking function. When two or more elements are used in combination, the total content should preferably fall in the above range.

The above-described metals or oxides, carbides, nitrides, silicides and borides of metals (inclusive of metalloids) are usually dispersed in the high resistance inorganic hole injecting and transporting layer. The dispersed particles generally have a particle size of about 1 to 5 nm. It is believed that a hopping path is created between the dispersed particles of conductor for carrying holes by way of the high resistance main component.

The high resistance inorganic hole injecting and transporting layer may contain as impurities H and Ne, Ar, Kr or Xe used as the sputtering gas, preferably in a total content of up to 5 at %.

As long as the overall high resistance inorganic hole injecting and transporting layer has the above-described composition on the average, the composition of the layer need not be uniform. A layer structure having a graded concentration in a thickness direction is acceptable.

The high resistance inorganic hole injecting and transporting layer is normally amorphous.

The thickness of the high resistance inorganic hole injecting and transporting layer is preferably about 0.2 to 100 nm, more preferably about 0.2 to 30 nm, most preferably about 0.2 to 10 nm. Outside the range, the high resistance inorganic hole injecting and transporting layer would fail to fully exert its own function.

Methods for preparing the high resistance inorganic hole injecting and transporting layer include various physical and chemical thin film formation methods such as sputtering and evaporation, with the sputtering being preferred. In particular, a multi-source sputtering process of sputtering distinct targets of the main component and the metal, metal oxide or the like is preferred. The multi-source sputtering process allows the respective targets to be sputtered by appropriate techniques. In the case of single-source sputtering, the composition may be controlled by placing a small piece of the metal, metal oxide or the like on a target of the main component and properly adjusting the area ratio of the piece to the target.

When the high resistance inorganic hole injecting and transporting layer is formed by sputtering, the depositing conditions are the same as in the case of the high resistance inorganic electron injecting and transporting layer.

The electron injecting electrode is preferably formed of materials having a low work function, for example, metal elements such as K, Li, Na, Mg, La, Ce, Ca, Sr, Ba, Al, Ag, In, Sn, Zn, and Zr, and binary or ternary alloys containing such metal elements for stability improvement. Exemplary alloys include Ag—Mg (Ag: 0.1 to 50 at %), Al—Li (Li: 0.01 to 14 at %), In—Mg (Mg: 50 to 80 at %), and Al—Ca (Ca: 0.01 to 20 at %). Notably, the electron injecting electrode can also be formed by evaporation or sputtering.

The electron injecting electrode thin film may have at least a sufficient thickness to effect electron injection, for example, a thickness of at least 0.5 nm, preferably at least 1 nm, more preferably at least 3 nm. Although the upper limit is not critical, the electrode thickness is typically about 3 to about 500 nm. On the electron injecting electrode, an auxiliary or protective electrode may be provided.

During evaporation, the pressure is preferably set at $1\times10^{-8}$ to $1\times10^{-5}$ Torr, and the heating temperature of the evaporation source is preferably about 100 to 1,400° C. for metal materials and about 100 to 500° C. for organic materials.

The hole injecting electrode is preferably a transparent or translucent electrode because the emitted light exits therefrom. Transparent electrodes are tin-doped indium oxide (ITO), zinc-doped indium oxide (IZO), zinc oxide (ZnO), tin oxide ($SnO_2$), indium oxide ($In_2O_3$), etc., with the ITO and IZO being preferred. The ITO generally contains $In_2O_3$ and SnO in a stoichiometric composition although the oxygen content may deviate therefrom. When transparency is unnecessary, the hole injecting electrode may be formed of well-known opaque metal materials.

The hole injecting electrode may have at least a sufficient thickness to effect hole injection, for example, a thickness of 50 to 500 nm, especially 50 to 300 nm. Although the upper limit of the electrode thickness is not critical, a too thick electrode would have the risk of separation. Too thin an electrode is insufficient in film strength during fabrication, hole transporting capability, and resistance value.

Although the hole injecting electrode layer can be formed by evaporation or the like, it is preferably formed by sputtering processes, especially pulse DC sputtering.

The organic layers of the organic EL device may be constructed as described below.

The light emitting layer has the functions of injecting holes and electrons, transporting them, and recombining holes and electrons to create excitons. It is preferred that relatively electronically neutral compounds be used in the light emitting layer.

The organic hole injecting and transporting layer has the functions of facilitating injection of holes from the hole injecting electrode or high resistance inorganic hole injecting and transporting layer, transporting holes stably, and blocking electrons. The organic electron injecting and transporting layer has the functions of facilitating injection of electrons from the high resistance inorganic electron injecting and transporting layer, transporting electrons stably, and blocking holes. These layers are effective for increasing the number of holes and electrons injected into the light emitting layer and confining holes and electrons therein for optimizing the recombination region to improve light emission efficiency.

The thicknesses of the light emitting layer, the hole injecting and transporting layer, and the electron injecting and transporting layer are not critical and vary with a particular formation technique although their thickness is usually preferred to range from about 5 nm to about 500 nm, especially about 10 nm to about 300 nm.

The thickness of the organic hole injecting and transporting layer and the electron injecting and transporting layer is equal to or ranges from about 1/10 times to about 10 times the thickness of the light emitting layer although it depends on the design of a recombination/light emitting region. When the hole or electron injecting and transporting layer is divided into an injecting layer and a transporting layer, preferably the injecting layer is at least 1 nm thick and the transporting layer is at least 1 nm thick. The upper limit of thickness is usually about 500 nm for the injecting layer and about 500 nm for the transporting layer. The same film thickness applies when two injecting/transporting layers are provided. Notably, the organic electron injecting and transporting layer is unnecessary when the device of the invention has a high resistance inorganic electron injecting and transporting layer, and the organic hole injecting and transporting layer is unnecessary when the device of the invention has a high resistance inorganic hole injecting and transporting layer.

The light emitting layer of the organic EL device contains a fluorescent material that is a compound having a light emitting capability. The fluorescent material may be at least one member selected from compounds as disclosed, for example, in JP-A 63-264692, such as quinacridone, rubrene, and styryl dyes. Also, quinoline derivatives such as metal complex dyes having 8-quinolinol or a derivative thereof as the ligand such as tris(8-quinolinolato)aluminum are included as well as tetraphenylbutadiene, anthracene, perylene, coronene, and 12-phthaloperinone derivatives. Further useful are the phenylanthracene derivatives described in JP-A 8-12600 (Japanese Patent Application No. 6-110569) and the tetraarylethene derivatives described in JP-A 8-12969 (Japanese Patent Application No. 6-114456).

It is preferred to use such a compound in combination with a host material capable of light emission by itself, that is, to use the compound as a dopant. In this embodiment, the content of the compound in the light emitting layer is preferably 0.01 to 20% by volume, especially 0.1 to 15% by volume. Especially in the case of rubrene series, the preferred content is 0.01 to 20% by volume. By using the compound in combination with the host material, the light emission wavelength of the host material can be altered, allowing light emission to be shifted to a longer wavelength and improving the luminous efficacy and stability of the device.

As the host material, quinolinolato complexes are preferable, with aluminum complexes having 8-quinolinol or a derivative thereof as the ligand being more preferable. These aluminum complexes are disclosed in JP-A 63-264692, 3-255190, 5-70733, 5-258859 and 6-215874.

Illustrative examples include tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Other useful host materials are the phenylanthracene derivatives described in JP-A 8-12600 (Japanese Patent Application No. 6-110569) and the tetraarylethene derivatives described in JP-A 8-12969 (Japanese Patent Application No. 6-114456).

The light emitting layer may also serve as the electron injecting and transporting layer. In this case, tris(8-quinolinolato)aluminum etc. are preferably used. These fluorescent materials may be evaporated.

Also, if necessary, the light emitting layer may also be a layer of a mixture of at least one hole injecting and transporting compound and at least one electron injecting and transporting compound, in which a dopant is preferably contained. In such a mix layer, the content of the compound is preferably 0.01 to 20% by volume, especially 0.1 to 15% by volume.

In the mix layer, carrier hopping conduction paths are created, allowing carriers to move through a polarly predominant material while injection of carriers of opposite polarity is rather inhibited, and the organic compound becomes less susceptible to damage, resulting in the advantage of an extended device life. By incorporating the aforementioned dopant in such a mix layer, the light emission wavelength the mix layer itself possesses can be altered, allowing light emission to be shifted to a longer wavelength and improving the luminous intensity and stability of the device.

The hole injecting and transporting compound and electron injecting and transporting compound used in the mix layer may be selected from compounds for the hole injecting and transporting layer and compounds for the electron injecting and transporting layer to be described later, respectively. Inter alia, the compound for the hole injecting and transporting layer is preferably selected from amine derivatives having intense fluorescence, for example, triphenyl-diamine derivatives which are hole transporting materials, styrylamine derivatives and amine derivatives having an aromatic fused ring.

The electron injecting and transporting compound is preferably selected from quinoline derivatives and metal complexes having 8-quinolinol or a derivative thereof as a ligand, especially tris(8-quinolinolato)aluminum (Alq3). The aforementioned phenylanthracene derivatives and tetraarylethene derivatives are also preferable.

For the hole injecting and transporting layer, amine derivatives having intense fluorescence are useful, for example, the triphenyldiamine derivatives, styrylamine derivatives, and amine derivatives having an aromatic fused ring, exemplified above as the hole transporting material.

The mix ratio is preferably determined in accordance with the carrier density and carrier mobility. It is usually preferred that the weight ratio of the hole injecting and transporting compound to the electron injecting and transporting compound range from about 1/99 to about 99/1, more preferably from about 10/90 to about 90/10, especially from about 20/80 to about 80/20.

Also preferably, the thickness of the mix layer ranges from the thickness of a mono-molecular layer to less than the thickness of the organic compound layer, specifically from 1 to 85 nm, more preferably 5 to 60 nm, especially 5 to 50 nm.

Preferably the mix layer is formed by a co-deposition process of evaporating the compounds from distinct sources. If both the compounds have approximately equal or very close vapor pressures or evaporation temperatures, they may be pre-mixed in a common evaporation boat, from which they are evaporated together. The mix layer is preferably a uniform mixture of both the compounds although the compounds can be present in island form. The light emitting layer is generally formed to a predetermined thickness by evaporating an organic fluorescent material or coating a dispersion thereof in a resin binder.

In the hole transporting layer, there may be used various organic compounds as described, for example, in JP-A 63-295695, 2-191694, 3-792, 5-234681, 5-239455, 5-299174, 7-126225, 7-126226, and 8-100172, and EP 0650955A1. Exemplary are tetraarylbenzidine compounds (triaryldiamines or triphenyldiamines: TPD), aromatic tertiary amines, hydrazone derivatives, carbazole derivatives, triazole derivatives, imidazole derivatives, oxadiazole derivatives having an amino group, and polythiophenes. These compounds may be used alone or in admixture of two or more. On combined use, they may be formed as separate layers or mixed.

Where the hole injecting and transporting layer is formed separately as a hole injecting layer and a hole transporting layer, two or more compounds are selected in a proper combination from the compounds commonly used in hole injecting and transporting layers. In this regard, it is preferred to laminate layers in such an order that a layer of a compound having a lower ionization potential may be disposed adjacent the hole injecting electrode (ITO). It is also preferred to use a compound having good thin film forming ability at the hole injecting electrode surface. The order of lamination also applies where a plurality of hole injecting and transporting layers are provided. Such an order of lamination is effective for lowering the drive voltage and preventing current leakage and the development and growth of dark spots. Since evaporation is utilized in the manufacture of devices, films as thin as about 1 to 10 nm can be formed uniform and pinhole-free, which restrains any change in color tone of light emission and a drop of efficiency by re-absorption even if a compound having a low ionization potential and absorption in the visible range is used in the hole injecting layer. Like the light emitting layer, the hole injecting and transporting layer may be formed by evaporating the above-mentioned compounds.

In the electron injecting and transporting layer, there may be used quinoline derivatives including organic metal complexes having 8-quinolinol or a derivative thereof as a ligand such as tris(8-quinolinolato)aluminum (Alq3), oxadiazole derivatives, perylene derivatives, pyridine derivatives, pyrimidine derivatives, quinoxaline derivatives, diphenylquinone derivatives, and nitro-substituted fluorene derivatives. The electron injecting and transporting layer can also serve as the light emitting layer. In this case, use of tris(8-quinolinolato)aluminum etc. is preferred. Like the light emitting layer, the electron injecting and transporting layer may be formed by evaporation or the like.

Where the electron injecting and transporting layer is formed separately as an electron injecting layer and an electron transporting layer, two or more compounds are selected in a proper combination from the compounds commonly used in electron injecting and transporting layers. In this regard, it is preferred to stack layers in such an order that a layer of a compound having a greater electron affinity may be disposed adjacent the electron injecting electrode. The order of stacking also applies where a plurality of electron injecting and transporting layers are provided.

In forming the hole injecting and transporting layer, the light emitting layer, and the electron injecting and transporting layer, vacuum evaporation is preferably used because homogeneous thin films are available. By utilizing vacuum evaporation, there is obtained a homogeneous thin film which is amorphous or has a crystal grain size of up to 0.2 $\mu$m. If the grain size is more than 0.2 $\mu$m, uneven light emission would take place and the drive voltage of the device must be increased with a substantial drop of charge injection efficiency.

The conditions for vacuum evaporation are not critical although a vacuum of $10^{-4}$ Pa or lower and a deposition rate of about 0.01 to 1 nm/sec. are preferred. It is preferred to successively form layers in vacuum because the successive formation in vacuum can avoid adsorption of impurities on the interface between the layers, thus ensuring better performance. Also, the drive voltage of a device can be reduced and the development and growth of dark spots be restrained.

In the embodiment wherein the respective layers are formed by vacuum evaporation, where it is desired for a single layer to contain two or more compounds, preferably boats having the compounds received therein are individually temperature controlled to achieve codeposition.

The switching device of the invention may be any semiconductor device which has a controlling electrode and a set of controlled electrodes formed on a non-single-crystal silicon substrate and can directly drive the organic EL device. In order that the apparatus function as a display, a switching device of the thin film transistor (TFT) type is preferred.

The substrate used herein is preferably formed of insulating, transparent materials such as quartz, sapphire, and glass. The term "transparent" means that in practical use in an organic EL display apparatus, the material has an ability to transmit a sufficient amount of light. For example, those materials allowing at least 50% of light to be transmitted in the desired light emission wavelength band are regarded transparent. Also, low strain point glass is a glass that is distorted at or above a temperature of about 700° C.

In the practice of the invention, thin film transistors (TFT) are used to drive the organic EL device.

Referring to FIG. 1, the switching device of the invention is described in further detail. FIG. 1 is a plan view illustrating one exemplary TFT array for driving the organic EL device.

In FIG. 1, a source bus 11 is connected to a source electrode 13 and to a source zone formed on a silicon substrate 21 via a contact hole 13a. On the silicon substrate 21 is formed a gate bus 12 which is commonly connected to TFTs of other pixels (not shown). A gate electrode is formed where the gate bus 12 intersects with the silicon substrate 21.

A drain line 14 is connected via a contact hole 14a to a drain zone which is formed on the silicon substrate and spaced apart from the source zone by the gate electrode. This drain line 14 is connected to a gate line 15 via a contact hole 14b. The gate line 15 is formed on a silicon substrate 22 constituting a TFT 2 and connected to one electrode of a capacitor 18. The capacitor 18 has another electrode connected to an earth bus 23 and to a source electrode 17, which is connected to a source zone of a TFT 1 via a contact hole 17a. A gate electrode is formed where the gate line 15 intersects with the silicon substrate 22.

A drain line 16 is connected via a contact hole 16a to a drain zone which is formed on the silicon substrate and spaced apart from the source zone by the gate electrode 15. The drain line 16 constitutes one electrode of the organic EL device serving as a pixel or is connected thereto.

The TFT 1 that directly drives the organic EL device is the switching device contemplated herein.

This switching device has an active layer which is a portion where n+/i/n+ regions are formed, for example. The symbol n+ indicates the region doped to N type and i indicates the undoped region. The doped regions of the active layer may also be p+ regions which are doped to P type. The active layer is preferably formed of polysilicon. Polysilicon exhibits sufficient stability to electric conduction as compared with amorphous silicon.

An α-Si layer which is a precursor of polysilicon can be deposited by various CVD processes although it is preferably deposited by a plasma CVD process. Thereafter, the layer is annealed by means of an excimer laser such as a KrF laser (248 nm) for crystallization. One useful exemplary technique is described in SID '96, Digest of technical papers, pp. 17–28.

Annealing by means of an excimer laser is preferably carried out by maintaining the substrate at a temperature of 100 to 300° C. and also using laser light having an energy quantity of 100 to 300 mJ/cm$^2$.

Besides, crystallization may also be accomplished using a conventional thermal annealing technique. Better results are obtained by the combined use of thermal annealing and laser annealing.

The polysilicon which has been subjected to activating treatment bears thereon a silicon thin film (known as high-temperature polysilicon film) which is formed by heat treatment at about 900° C. or a silicon thin film (known as low-temperature polysilicon film) which is formed at relatively low temperatures below 600° C. The active layer used herein may be either high-temperature polysilicon or low-temperature polysilicon.

The active layer, that is, α-Si layer has a thickness of 100 to 800 Å, and preferably 300 to 500 Å.

By photolithography, the active layer (or polysilicon layer) is patterned into islands of the arrangement required as the switching device.

As the substrate used herein, quartz, ceramics, sapphire and glass having insulating properties are useful, with inexpensive materials such as low strain point glass being preferred. When a glass substrate is used, annealing is carried out at low process temperatures in order to avoid melting or distortion of the glass and avoid out-diffusion of the dopant into the active regions throughout the manufacture of TFT-EL. In this way, all manufacturing steps must be performed on the glass substrate below 800° C., preferably below 600° C.

To construct the controlling electrode, an insulating gate material is preferably deposited on the polysilicon islands and over the surface of the insulating substrate. The insulating material is preferably silicon dioxide ($SiO_2$) which is deposited by chemical vapor deposition (CVD) processes such as plasma CVD (PECVD) or low pressure. CVD (LPCVD). The gate oxide insulating layer preferably has a thickness of about 50 to 200 nm. The substrate temperature is preferably 250 to 400° C. Annealing is preferably carried out at 300 to 600° C. for about 1 to 3 hours in order to produce an insulating gate material of higher quality.

Further, the controlling electrode is prepared, for example, by forming a gate electrode by evaporation or sputtering and patterning the gate electrode. The gate electrode preferably has a thickness of 100 to 500 nm.

One preferred gate forming method is the following technique using polysilicon as the gate.

<n-type P-doped polysilicon>

The gate electrode is prepared by forming P-doped α-Si by the plasma CVD process, annealing it at 600° C. for polycrystallization to form n-type polycrystalline silicon, and patterning it by photolithography.

If necessary, signal electrode lines and scanning electrode lines are formed. Metal lines of Al alloy, Al, Cr, W, Mo or the like are formed by photolithography.

Also, when Al gates are used, preferably anodic oxidation is carried out twice in order to provide insulation. The anodic oxidation is disclosed in detail in JP-B 8-15120.

Further, n+ or p+ regions are formed by ion doping.

Contacts to the drain and source serving as the controlled electrodes are made where apertures are formed in the insulating film. of the above-described insulating films, $SiO_2$ can be obtained by PECVD using tetraethoxysilane (TEOS) as the gas and setting the substrate at a temperature of 250 to 400° C. Alternatively, it can be obtained by ECR-CVD with the substrate set at a temperature of 100 to 300° C.

An interlayer insulating film may be formed, for example, by the following method.

Silica $SiO_2$ is deposited, preferably to 0.2 to 3 μm, by etching back methods based on plasma etching, various CVD methods, plasma CVD, plasma enhanced CVD (PECVD), or low pressure CVD (LPCVD).

By this method, a flattened interlayer insulating film ($SiO_2$) is obtainable. Like silica, phosphorus silica glass (PSG) and boron silica glass (BSG) may be used in this method, and silicon nitride compounds such as $Si_3N_4$ may also be used.

In this way, the switching device is formed.

The switching device has an off-current of up to $1\times10^{-8}$ A, especially up to $1\times10^{-10}$ A. The lower limit is not critical and less off-current is better. Usually the lower limit is about $1\times10^{-13}$ A, preferably about $1\times10^{-4}$ A. The increased off-current would invite erroneous light emission and a contrast drop.

The switching device preferably has a field effect mobility of up to 60 cm$^2$/V·sec, especially 30 to 50 cm$^2$/V·sec.

Next, one specific construction of the switching device of the invention and its manufacturing steps are described with reference to the drawings.

Figure 2:
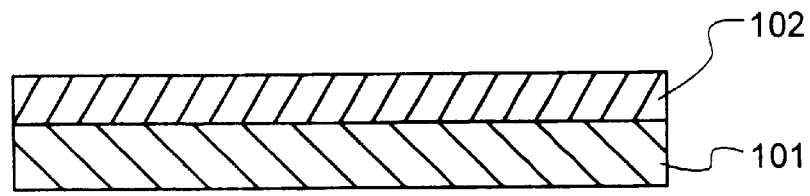
FIG. 2 is a fragmental cross-sectional view illustrating one step of a process for manufacturing an organic EL display apparatus according to the invention.

First, as shown in FIG. 2, a α-Si layer 102 is formed on a substrate 101 by sputtering or various CVD processes, preferably by plasma CVD.

Figure 3:
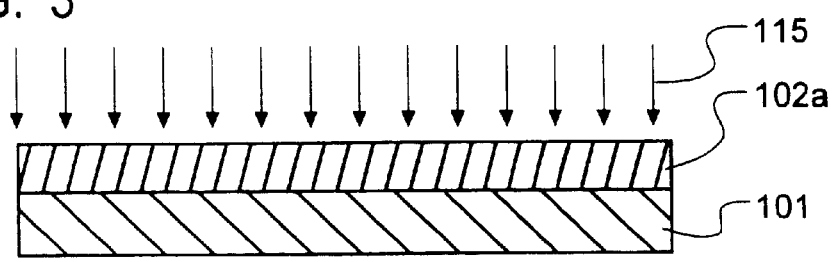
FIG. 3 is a fragmental cross-sectional view illustrating one step of a process for manufacturing an organic EL display apparatus according to the invention.

Then, as shown in FIG. 3, the layer is annealed for crystallization by means of an excimer laser 115 or the like, forming an active layer 102a.

Figure 4:
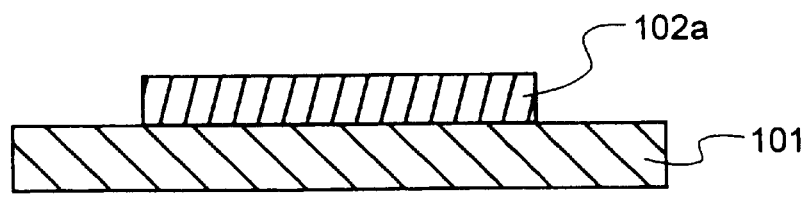
FIG. 4 is a fragmental cross-sectional view illustrating one step of a process for manufacturing an organic EL display apparatus according to the invention.

Further, as shown in FIG. 4, the crystallized active layer (polysilicon layer) 102a is patterned into an island by photolithography.

Figure 5:
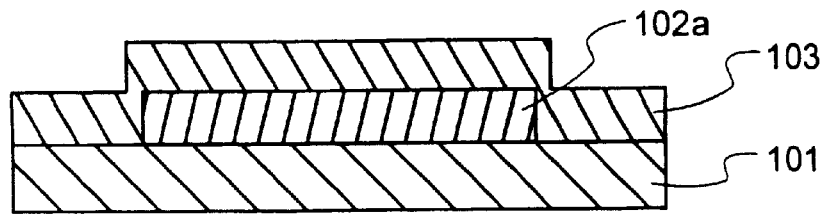
FIG. 5 is a fragmental cross-sectional view illustrating one step of a process for manufacturing an organic EL display apparatus according to the invention.

Next, as shown in FIG. 5, an insulating gate 103 is deposited on the polysilicon island 102a and over the surface of the insulating substrate 101. The substrate temperature is preferably 250 to 400° C. Preferably, annealing is carried out at 300 to 600° C. for about 1 to 3 hours in order to produce an insulating gate material of higher quality.

Figure 6:
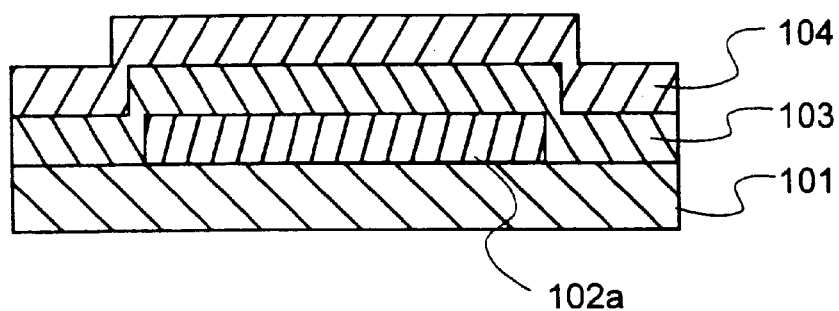
FIG. 6 is a fragmental cross-sectional view illustrating one step of a process for manufacturing an organic EL display apparatus according to the invention.

Next, as shown in FIG. 6, a gate electrode 104 is deposited by evaporation or sputtering.

Figure 7:
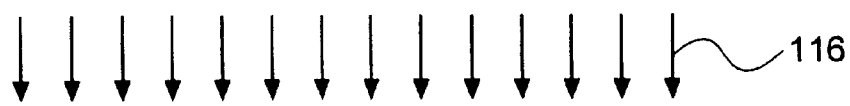
FIG. 7 is a fragmental cross-sectional view illustrating one step of a process for manufacturing an organic EL display apparatus according to the invention.
Figure 7:
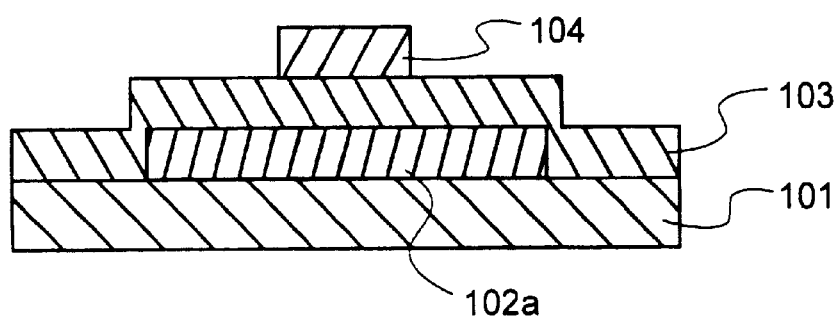

Next, as shown in FIG. 7, the gate electrode 104 is patterned, ion doping 116 is carried out from above the patterned gate electrode 104 to form n+ or p+ zones, and signal electrode lines and scanning electrode lines are formed by photolithography.

Next, contacts to the drain and source are formed. The contacts are made in apertures in the insulating film 111. First, a $SiO_2$ film is deposited as an interlayer insulating layer by atmospheric CVD. Then the interlayer insulating layer is etched to form contact holes, providing apertures for drain and source connection.

Figure 8:
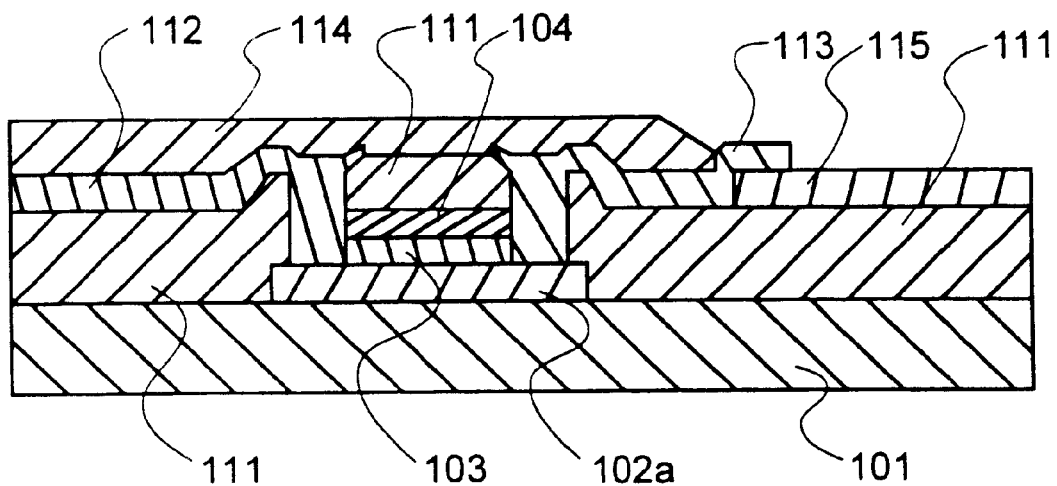
FIG. 8 is a fragmental cross-sectional view illustrating one step of a process for manufacturing an organic EL display apparatus according to the invention.

In the apertures for drain and source connection, a drain interconnect electrode 112 and a source interconnect electrode 113 are deposited to achieve connection to drain and source electrodes. Herein, either one of the drain and source electrodes functions as a first or second electrode of the organic EL device or is connected thereto. In the illustrated embodiment, the electrode 113 is connected to the ITO 115 serving as the hole injecting electrode. Further, an insulating film 114 is formed on the drain interconnect electrode 112, and at the same time, an edge cover covering the region other than the pixel area is formed, yielding a switching device as shown in FIG. 8.

Figure 9:
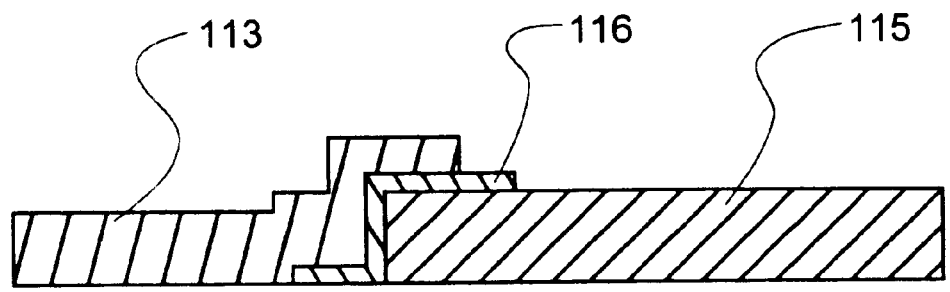
FIG. 9 is a fragmental cross-sectional view illustrating one step of a process for manufacturing an organic EL display apparatus according to the invention.

It is noted that for connection to the electrodes of the organic EL device, typically the hole injecting electrode, a connecting metal layer 116 of TiN or the like may be formed between the interconnect electrode 113 and the hole injecting electrode 115 to improve the connection therebetween as shown in FIG. 9, for example.

Next, the construction of the organic EL device used in the invention is described. The organic EL device has between first and second electrodes an organic layer containing an organic material participating in at least a light emitting function. Electrons and holes are fed from the first and second electrodes into the organic layer where they are recombined to emit light.

The first and second electrodes may be hole and electron injecting electrodes, respectively, or vice versa. Often, the first electrode on the substrate side becomes a hole injecting electrode and the second electrode becomes an electron injecting electrode.

Figure 10:
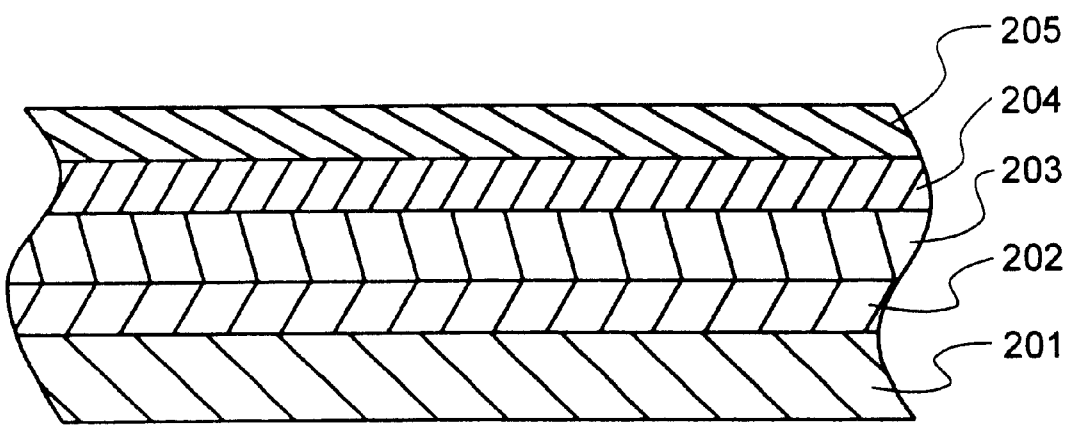
FIG. 10 is a schematic cross-sectional view of one exemplary construction of an organic EL device according to the invention.
Figure 11:
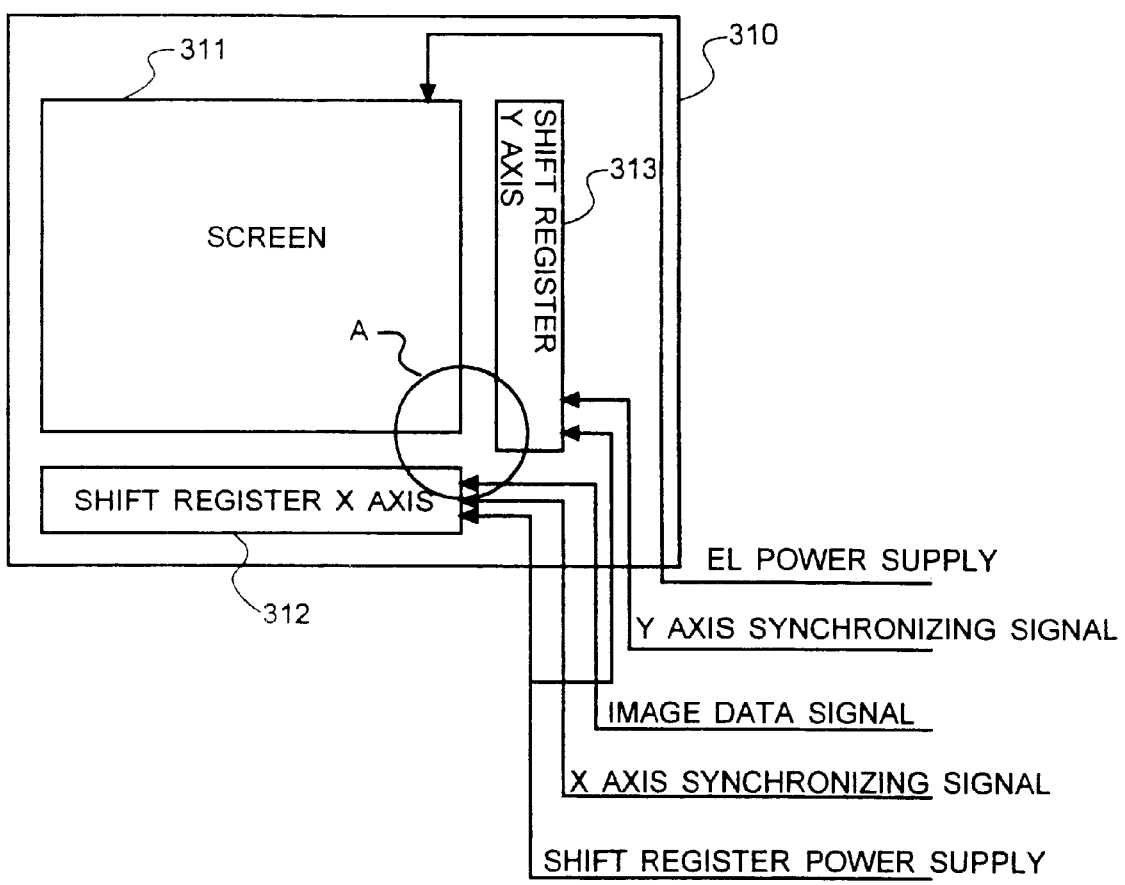
FIG. 11 is a block diagram showing one exemplary construction of an organic EL display apparatus.
Figure 12:
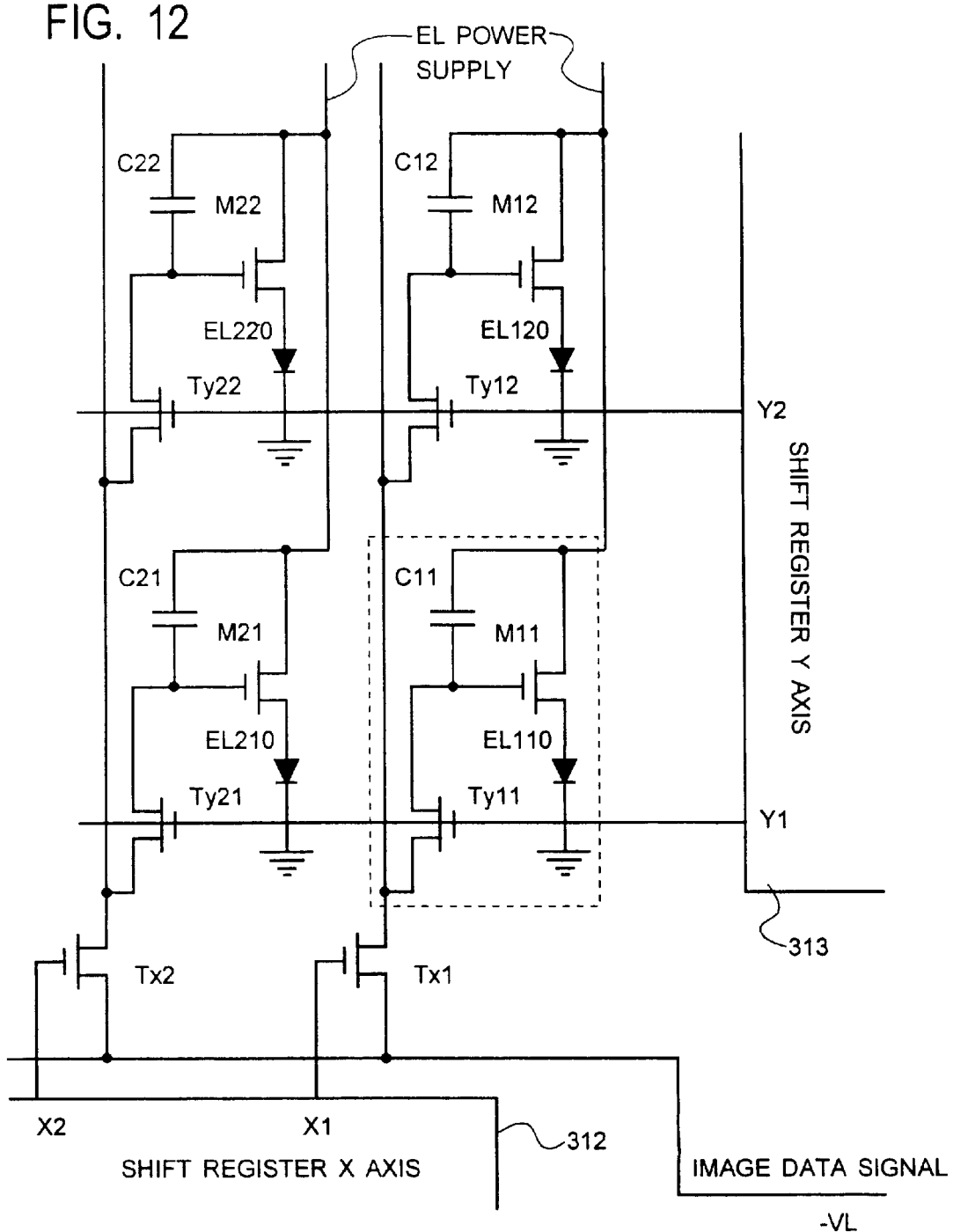
FIG. 12 is an enlarged view of a portion delimited by circle A in FIG. 11.

More illustratively, as shown in FIG. 10, for example, a positive electrode (or hole injecting electrode) 201 connected to the switching device, a high resistance inorganic hole injecting and transporting layer 202, a light emitting layer 203, a high resistance inorganic electron injecting and transporting layer 204, and a negative electrode (or electron injecting electrode) 205 are sequentially stacked. The order of stacking may be reversed, or the negative electrode (or electron injecting electrode) may be connected to the switching device. A proper choice may be made among these embodiments depending on the desired performance of the display apparatus, the properties of the display apparatus required from the design, and other factors.

The substrate may be provided with a color filter film, a fluorescent material-containing color conversion film or a dielectric reflecting film for controlling the color of light emission.

The color filter film used herein may be a color filter as used in liquid crystal displays and the like. The properties of a color filter may be adjusted in accordance with the light emission of the organic EL device so as to optimize the extraction efficiency and color purity.

It is also preferred to use a color filter capable of cutting external light of short wavelength which is otherwise absorbed by the EL device materials and fluorescence conversion layer, because the light resistance and display contrast of the device are improved.

An optical thin film such as a dielectric multilayer film may be used instead of the color filter.

The fluorescence conversion filter film is to convert the color of light emission by absorbing electroluminescence and allowing the fluorescent material in the film to emit light. It is formed from three components: a binder, a fluorescent material, and a light absorbing material.

The fluorescent material used may basically have a high fluorescent quantum yield and desirably exhibits strong absorption in the electroluminescent wavelength region. In practice, laser dyes are appropriate. Use may be made of rhodamine compounds, perylene compounds, cyanine compounds, phthalocyanine compounds (including subphthalocyanines), naphthalimide compounds, fused ring hydrocarbon compounds, fused heterocyclic compounds, styryl compounds, and coumarin compounds.

The binder is selected from materials which do not cause extinction of fluorescence, preferably those materials which can be finely patterned by photolithography or printing technique. Also, where the filter film is formed on the substrate so as to be contiguous to the hole injecting electrode, those materials which are not damaged during deposition of the hole injecting electrode (such as ITO or IZO) are preferable.

The light absorbing material is used when the light absorption of the fluorescent material is short and may be omitted if unnecessary. The light absorbing material may also be selected from materials which do not cause extinction of fluorescence of the fluorescent material.

The organic EL device used in the invention is generally used as an EL device of the dc drive type or pulse drive type. The applied voltage is generally about 2 to 30 volts.

EXAMPLE 1

On a heat resistant alkali-free glass substrate of Corning 1737 glass, an amorphous silicon layer was deposited to a thickness of about 600 Å by a CVD process. The depositing conditions are given below.

$Si_2H_6$ gas: 100 SCCM
Pressure: 0.3 Torr
Temperature: 480° C.

Then the amorphous silicon layer was solid phase grown into an active layer (polysilicon layer). For the solid phase growth, thermal annealing was combined with laser annealing. The conditions are given below.

Thermal annealing
$N_2$: 1 SLM
Temperature: 600° C.
Treating time: 24 hours
Laser annealing
KrF: 254 nm
Energy density: 200 mJ/cm$^2$
Number of shots: 50

Next, the polysilicon layer was patterned, obtaining an active silicon layer of 500 Å thick.

On this active silicon layer, a $SiO_2$ layer to become a gate oxide film was deposited to about 800 Å, for example, by a plasma CVD process. The depositing conditions are given below.

Input power: 50 W
TEOS (tetraethoxysilane) gas: 50 SCCM
$O_2$: 500 SCCM
Pressure: 0.1–0.5 Torr
Temperature: 350° C.

On the $SiO_2$ layer, a Mo—$Si_2$ layer to become a gate electrode was deposited to about 1,000 Å by sputtering. This Mo—$Si_2$ layer and the previously formed $SiO_2$ layer were then patterned, for example, by dry etching, to form a gate electrode and a gate oxide film.

Next, using the gate electrode as a mask, the regions of the active silicon layer to become source and drain regions were doped with an N-type impurity P by an ion doping process.

Next, the structure was heated in a nitrogen atmosphere at about 550° C. for 10 hours to effect dopant activation. Further, it was heat treated in a hydrogen atmosphere at about 400° C. for 30 minutes to effect hydrogenation, thereby reducing the defect level density of the semiconductor.

Then, an $SiO_2$ layer to become an interlayer insulating layer was formed to a thickness of about 8,000 Å over the substrate. The depositing conditions of $SiO_2$ to become an interlayer insulating layer are given below.

$O_2/N_2$: 10 SLM
5% $SiH_4/N_2$: 1 SLM
1% $PH_3/N_2$: 500 SCCM
$N_2$: 10 SLM
Temperature: 410° C.
Pressure: atmospheric The $SiO_2$ layer to become an interlayer insulating layer was etched to form contact holes. Al was then evaporated as drain and source interconnect electrodes.

The thus obtained TFT array had an S value of 1.0 V/decade and an off-current of $4 \times 10^{-10}$ A.

Next, in the region where an organic EL device was to be formed, ITO was deposited to provide connection to the interconnect electrode.

In the pixel regions of the TFT thin film pattern sample according to the invention (on the ITO) thus fabricated, a high resistance electron injecting and transporting layer and organic layers including a light emitting layer were deposited by vacuum evaporation. The deposited materials are given below. Exemplary materials are given herein although any material which can be deposited by evaporation is applicable in the invention as is evident from the concept of these layers.

After the substrate surface on which the ITO electrode layer etc. were formed was cleaned with UV/ozone, the substrate was secured by a holder in a vacuum evaporation chamber, which was evacuated to a vacuum of $1 \times 10^{-4}$ Pa or lower.

With the vacuum kept, N,N,N',N'-tetrakis(m-biphenyl)-1,1'-biphenyl-4,4'-diamine (TPD) was evaporated at an overall deposition rate of 0.2 nm/sec to a thickness of 200 nm, forming a hole injecting and transporting layer.

Further with the vacuum kept, N,N,N',N'-tetrakis(m-biphenyl)-1,1'-biphenyl-4,4'-diamine (TPD), tris(8-quinolinolato)aluminum (Alq3), and rubrene were evaporated at an overall deposition rate of 0.2 nm/sec to a thickness of 100 nm, forming a light emitting layer. It was a mixture of TPD:Alq3=1:1 (volume ratio) which was doped with 10 vol % of rubrene.

Next, the substrate was transferred to a sputtering chamber where a high resistance inorganic electron injecting layer was deposited to a thickness of 10 nm using a target of $Li_2O$ having 4 mol % of V admixed therewith. The sputtering gas used was a mixture of 30 sccm of Ar and 5 sccm of $O_2$. Sputtering conditions included room temperature (25° C.), a deposition rate of 1 nm/min, an operating pressure of 0.2–2 Pa, and an input power of 500 W. The inorganic electron injecting layer as deposited had substantially the same composition as the target.

With the vacuum kept, Al was evaporated to a thickness of 100 nm to form a negative electrode. Finally, a glass shield was sealed to complete an organic LE device.

The organic EL display apparatus thus obtained was driven in air at a constant current density of 10 mA/$cm^2$, finding an initial luminance per device (or pixel) of 900 cd/$m^2$ and a drive voltage of 7.5 volts.

By the four-terminal method, the sheet resistance of the high resistance inorganic electron injecting layer was measured. The layer had a sheet resistance of 10 k$\Omega$/$cm^2$ at a thickness of 100 nm, which corresponds to a resistivity of $1 \times 10^9$ $\Omega$-cm.

EXAMPLE 2

In Example 1, $Li_2O$ was changed to at least one oxide selected from among alkali metal elements Na, K, Rb, Cs and Fr, alkaline earth metal elements Be, Mg, Ca, Sr, Ba and Ra, and lanthanide elements La, Ce, Pr, Nd, Pm, Sm, Eu, Gd, Tb, Dy, Ho, Er, Tm, Yb and Lu, with similar results obtained.

Similar results were obtained when V was changed to at least one element selected from among Ru, Zn, Sm, and In.

EXAMPLE 3

In the step of depositing the hole injecting and transporting layer in Examples 1 and 2, a Au pellet of the predetermined size was rested on a target of $SiO_2$. A high resistance inorganic hole injecting layer was deposited to a thickness of 20 nm. The sputtering gas used was a mixture of 30 sccm of Ar and 5 SCCM Of $O_2$. Sputtering conditions included room temperature (25° C.), a deposition rate of 1 nm/min, an operating pressure of 0.2–2 Pa, and an input power of 500 W. The inorganic hole injecting layer as deposited had a composition of $SiO_{1.9}$ containing 4 mol % of Au.

Otherwise as in Example 1, an organic EL device was manufactured. The organic EL display apparatus obtained was driven at a constant current density of 10 mA/$cm^2$ as in Example 1, finding an initial luminance per device of 950 cd/$m^2$ and a drive voltage of 7 volts.

Also, organic EL devices were fabricated as above except that in the step of depositing the high resistance inorganic hole injecting layer, the composition of the layer was changed to $SiO_{1.7}$, $SiO_{1.95}$, $GeO_{1.96}$, and $Si_{0.5}Ge_{0.5}O_{1.92}$ by controlling the flow rate of $O_2$ in the sputtering gas and the target in accordance with the desired film composition. When the luminance of light emission was evaluated, approximately equivalent results were obtained.

EXAMPLE 4

In the step of depositing the high resistance inorganic hole injecting and transporting layer in Example 3, a Au pellet of the predetermined size was rested on a target of $GeO_2$. A high resistance inorganic hole injecting and transporting layer was deposited to a thickness of 20 nm. The sputtering gas used was a mixture of 30 sccm of Ar and 5 sccm of $O_2$. Sputtering conditions included room temperature (25° C.), a deposition rate of 1 nm/min, an operating pressure of 0.2–2 Pa, and an input power of 500 W. The inorganic hole injecting and transporting layer as deposited had a composition of $GeO_2$ containing 2 mol % of Au.

Otherwise as in Example 3, an organic EL display apparatus was manufactured. When the apparatus was evaluated as in Example 3, approximately equivalent results to Example 1 were obtained.

EXAMPLE 5

Light emitting diodes were fabricated as in Example 3 except that in the step of depositing the high resistance inorganic hole injecting and transporting layer in Example 3, the composition of the main component of the layer was changed to $SiO_{1.7}$, $SiO_{1.95}$, $GeO_{1.96}$, and $Si_{0.5}Ge_{0.5}O_{1.92}$ by controlling the flow rate of $O_2$ in the sputtering gas and the target in accordance with the desired film composition. When the luminance of light emission was evaluated, approximately equivalent results were obtained.

EXAMPLE 6

Equivalent results were obtained when the metal of the high resistance inorganic hole injecting and transporting layer in Example 3 was changed from Au to at least one member of Cu, Fe, Ni, Ru, Sn, Cr, Ir, Nb, Pt, W, Mo, Ta, Pd and Co or an oxide, carbide, nitride, silicide or boride thereof.

EXAMPLE 7

Instead of depositing the high resistance inorganic hole injecting and transporting layer in Example 3, an inorganic insulative hole injecting layer was deposited to a thickness of 2 nm using a target of $SiO_2$. The sputtering gas used was Ar having 5% of $O_2$ admixed therein. Sputtering conditions included a substrate temperature of 25° C., a deposition rate of 1 nm/min, an operating pressure of 0.5 Pa, and an input power of 5 W/cm². The hole injecting layer as deposited had a composition of $SiO_{1.9}$.

Otherwise as in Example 3, an organic El display apparatus was manufactured. When the organic El display apparatus was evaluated as in Example 3, approximately equivalent results were obtained.

As is evident from the scope and spirit of the invention, the invention is not limited to the constituent layers and layer stacking order of organic EL devices employed in Examples. Other materials may be used in the hole injecting layer, light emitting layer, second electrode, and interconnect electrode. A multilayer structure may be implemented by further forming a hole injecting layer, an electron transporting layer, an electron injecting layer, etc. Differently stated, the invention can be implemented without any limit on the type of deposited materials and the structure.

BENEFITS OF THE INVENTION

According to the invention, an organic EL display apparatus using an organic EL device capable of light emission to a high luminance at a relatively low voltage so that the apparatus is prevented from erroneous light emission and a drop of contrast and features a high operating speed is accomplished.

What is claimed is:

1. An organic EL display apparatus comprising a switching device comprising a controlling electrode and a set of controlling electrodes formed on a non-single-crystal silicon substrate, and
    an organic EL device adapted to be driven by the switching device and comprising a positive electrode, a negative electrode, and an organic layer between the electrodes participating in at least a light emitting function, said organic EL device further comprising a high resistance inorganic electron injecting and transporting layer between said organic layer and said negative electrode capable of blocking holes and having conduction paths for carrying electrons, and a high resistance inorganic hole injecting and transporting layer between said organic layer and said positive electrode capable of blocking electrons and having conduction paths for carrying holes.

2. The organic EL display apparatus of claim 1 wherein said high resistance inorganic electron injecting and transporting layer contains
    at least one oxide of an element selected from the group consisting of alkali metal elements, alkaline earth metal elements, and lanthanide elements, the oxide having a work function of up to 4 eV, as a first component and
    at least one metal having a work function of 3 to 5 eV as a second component.

3. The organic EL display apparatus of claim 1 or 2 wherein said second component is at least one element selected from the group consisting of Zn, Sn, V, Ru, Sm, and In.

4. The organic EL display apparatus of claim 2, wherein said alkali metal element is at least one element selected from the group consisting of Li, Na, K, Rb, Cs and Fr, said alkaline earth metal element is at least one element selected from the group consisting of Mg, Ca, and Sr, and said lanthanide element is selected from La and Ce.

5. The organic EL display apparatus of claim 1 wherein said high resistance inorganic electron injecting and transporting layer has a resistivity of 1 to $1 \times 10^{11}$ Ω-cm.

6. The organic EL display apparatus of claim 2, wherein said high resistance inorganic electron injecting and transporting layer contains 0.2 to 40 mol % of the second component.

7. The organic EL display apparatus of claim 1 wherein said high resistance inorganic electron injecting and transporting layer has a thickness of 0.2 to 30 nm.

8. The organic EL display apparatus of claim 1 wherein said high resistance inorganic hole injecting and transporting layer has a resistivity of 1 to $1 \times 10^{11}$ Ω-cm.

9. The organic EL display apparatus of claim 1 wherein said high resistance inorganic hole injecting and transporting layer contains a metal and/or at least one member selected from the group consisting of an oxide, carbide, nitride, silicide and boride of the metal.

10. The organic EL display apparatus of claim 1 wherein said high resistance inorganic hole injecting and transporting layer contains
    an oxide of silicon and/or germanium as a main component, the main component being represented by $(Si_{1-x}Ge_x)O_y$ wherein $0 \leq x \leq 1$ and $1.7 \leq y \leq 2.2$, and
    metal having a work function of at least 4.5 eV and/or at least one member selected from the group consisting of an oxide, carbide, nitride, silicide and boride of the metal.

11. The organic EL display apparatus of claim 10 wherein said metal is at least one member selected from the group consisting of Au, Cu, Fe, Ni, Ru, Sn, Cr, Ir, Nb, Pt, W, Mo, Ta, Pd, and Co.

12. The organic EL display apparatus of claim 10 wherein the content of the metal and/or the oxide, carbide, nitride, silicide and boride of the metal is 0.2 to 40 mol %.

13. The organic EL display apparatus of claim 1 wherein said high resistance inorganic hole injecting and transporting layer has a thickness of 0.2 to 100 nm.

14. The organic EL display apparatus of claim 1 wherein said switching device is a thin film transistor.

15. The organic EL display apparatus of claim 1 wherein in said switching device, the non-single-crystal silicon substrate has an active layer with a thickness of 100 to 800 Å.

16. The organic EL display apparatus of claim 1 wherein said switching device has an off-current of up to $1 \times 10^{-8}$ A.

* * * * *